(12) United States Patent
Ayyapureddi et al.

(10) Patent No.: US 12,170,127 B2
(45) Date of Patent: Dec. 17, 2024

(54) BUFFER CONFIGURATIONS FOR COMMUNICATIONS BETWEEN MEMORY DIES AND A HOST DEVICE

(71) Applicant: Micron Technology, Inc., Boise, ID (US)

(72) Inventors: Sujeet V. Ayyapureddi, Boise, ID (US); Brent Keeth, Boise, ID (US); Matthew A. Prather, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 173 days.

(21) Appl. No.: 18/086,991

(22) Filed: Dec. 22, 2022

(65) Prior Publication Data

US 2023/0206969 A1 Jun. 29, 2023

Related U.S. Application Data

(60) Provisional application No. 63/266,091, filed on Dec. 28, 2021.

(51) Int. Cl.
*G11C 7/10* (2006.01)
*G11C 7/22* (2006.01)
*G11C 5/04* (2006.01)

(52) U.S. Cl.
CPC ............ *G11C 7/109* (2013.01); *G11C 7/1084* (2013.01); *G11C 7/222* (2013.01); *G11C 5/04* (2013.01); *G11C 7/1057* (2013.01); *G11C 2207/101* (2013.01)

(58) Field of Classification Search
CPC ....... G11C 7/109; G11C 7/1084; G11C 7/222; G11C 5/04; G11C 7/1057
USPC .......................................................... 365/191
See application file for complete search history.

(56) References Cited

U.S. PATENT DOCUMENTS

| | | | |
|---|---|---|---|
| 2013/0007333 A1* | 1/2013 | Fai | G06F 13/4086 710/313 |
| 2020/0272564 A1* | 8/2020 | Keeth | G11C 7/1012 |
| 2021/0397371 A1* | 12/2021 | Ballapuram | G06F 3/0604 |
| 2022/0405215 A1* | 12/2022 | Ou | G06F 13/1673 |

* cited by examiner

*Primary Examiner* — Ly D Pham
(74) *Attorney, Agent, or Firm* — Holland & Hart LLP

(57) ABSTRACT

Methods, systems, and devices for buffer configurations for communications between memory dies and a host device are described. A memory device may include a buffer having a first interface coupled with a host device and a second interface coupled with a memory die of the memory device. The first interface may communicate information with the host device at a first frequency and according to a first signaling scheme, and the second interface may communicate information with the memory die at a second frequency and according to a second signaling scheme. The first frequency may be higher than the second frequency, and the second signaling scheme may include a greater quantity of voltage levels than the first signaling scheme.

24 Claims, 6 Drawing Sheets

BUFFER CONFIGURATIONS FOR COMMUNICATIONS BETWEEN MEMORY DIES AND A HOST DEVICE

CROSS REFERENCE

The present application for patent claims priority to U.S. Patent Application No. 63/266,091 by BUCH et al., entitled "BUFFER CONFIGURATIONS FOR COMMUNICATIONS BETWEEN MEMORY DIES AND A HOST DEVICE," filed Dec. 28, 2021, which is assigned to the assignee hereof, and which is expressly incorporated by reference herein.

FIELD OF TECHNOLOGY

The following relates generally to one or more systems for memory and more specifically to buffer configurations for communications between memory dies and a host device.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
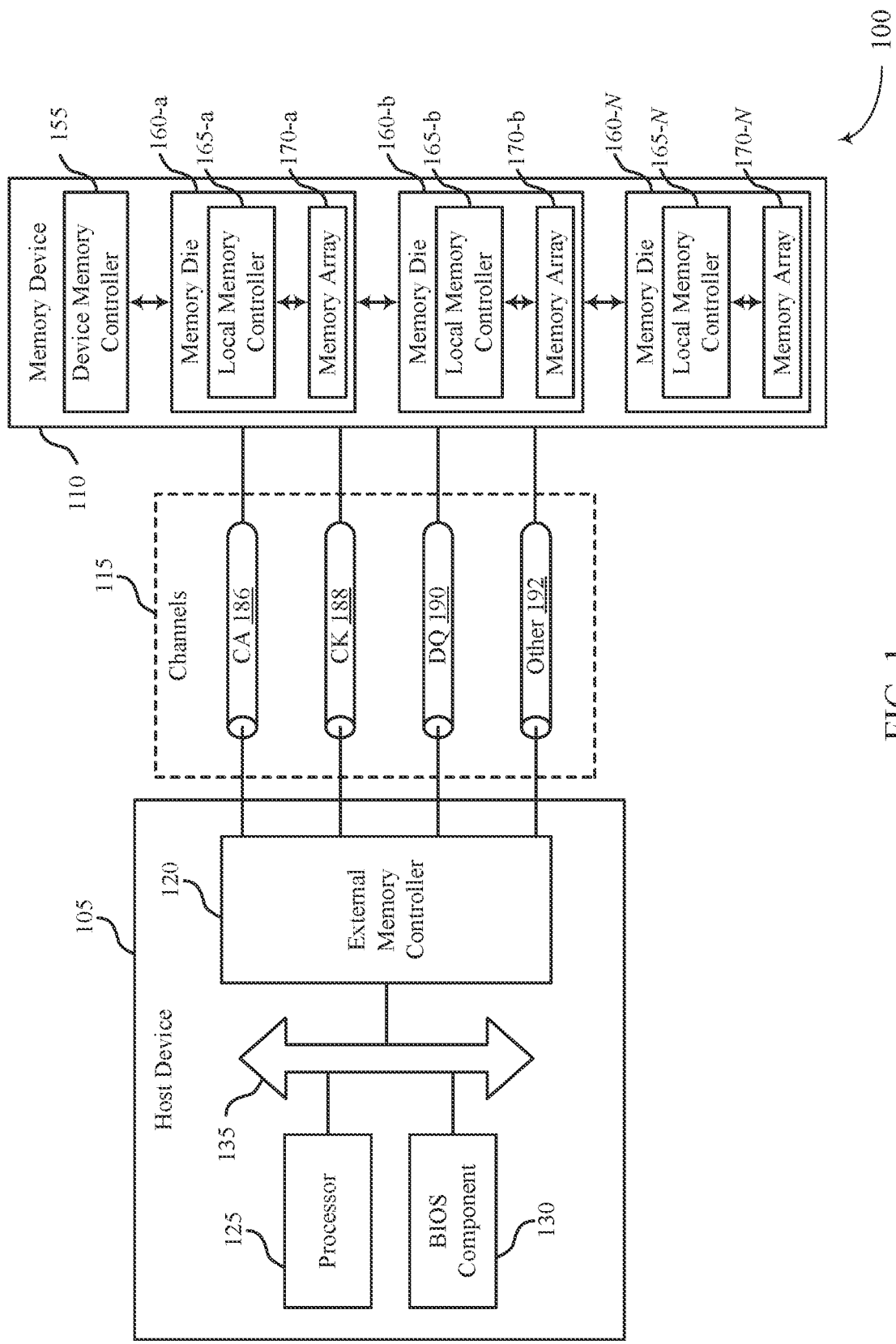
FIG. 1 illustrates an example of a system that supports buffer configurations for communications between memory dies and a host device in accordance with examples as disclosed herein.

A memory device and a host device may communicate information over various channels, such as command and address (CA) channels, clock signal (CK) channels, and data channels, among other types of channels. The memory device and the host device may implement various signaling schemes (e.g., modulations schemes) to communicate the information over the channels. For example, the memory device and the host device may communicate signals using a binary-level modulation scheme, in which each symbol may represent one bit of information, or a multi-level modulation scheme, in which each symbol may represent more than one bit of information. Additionally, in some examples, the memory device may implement a gearing scheme in which the memory device includes a buffer between the host device and a memory die of the memory device. The buffer may output, to the host device or the memory die, information at a different frequency at which the information was received (e.g., from the memory die or the host device). For example, a two-to-one (2:1) gearing of data may include outputting the data to the host device at twice an operating frequency of the memory die. As a result, the memory device may increase data rates of communications between the memory device and the host device. Gearing may reduce the clock frequency of signals to the memory die, which may save power or reduce signaling errors.

However, gearing typically results in scaling constraints for a size of the memory device. In some cases, a size of a memory device may be increased in order to support the gearing of communications between the memory device and a host device. For example, the memory device may route information (e.g., data and access commands, among other types of information) communicated between the memory die and the host device through the buffer that performs the gearing. But, in some cases, channel quantities and/or widths between the memory die and the buffer may be increased to support the gearing. For example, in a 2:1 gearing implementation in which data is communicated over ×16 data channels (e.g., data channels having sixteen signal paths) with the host device, the memory device may include two ×16 data channels or one ×32 channel between the memory die and the buffer for each ×16 data channel between the buffer and the host device. In other words, the memory die and the buffer may communicate the data over a first quantity of signals paths that is double a second quantity of signal paths included between the buffer and the host device in order to provide sufficient bandwidth to support a same data rate where communication between the host device and the buffer is performed at double the frequency (e.g., in order to maintain a same data rate between the buffer and the memory die and between the buffer and the host device). As a result, a size (e.g., a physical size) of each memory die included in the memory device may be increased to accommodate the increased quantity of signal paths. That is, an increased quantity of data pads or pins at each memory die corresponding to the increased quantity of signal paths may result in a die size larger than would otherwise accommodate a given amount of memory cells, thereby increasing a size of the memory die used in the memory device. Alternatively, a quantity of memory dies included in the memory device may be increased to increase the quantity of signal paths included between the buffer and memory dies of the memory device so that the sufficient bandwidth may be supported.

Techniques, systems, and devices are described herein to enable memory device gearing while supporting enhanced flexibility of memory device scaling. For example, a memory device may include one or more memory dies and a buffer that supports such gearing. For instance, the buffer may communicate information with the one or more memory dies at a first frequency and may communicate information with a host device at a second frequency greater than the first frequency (e.g., double the first frequency in a 2:1 gearing scheme), thereby gearing the communicated information between the first frequency and the second frequency. In order to perform such gearing while enhancing flexibility of memory device scaling, the buffer may communicate the information with the one or more memory dies according to a first signaling scheme (e.g., modulation scheme) having a first quantity of voltage levels (e.g., a pulse amplitude modulation (PAM) scheme having four voltage levels (PAM4)). The buffer may also communicate the information with the host device according to a second signaling scheme having a second quantity of voltage levels that is less than the first quantity of voltage levels (e.g., a binary-level modulation scheme). Accordingly, a signal communicated using the first signaling scheme may represent more bits of information for each clock cycle than a signal communicated using the second signaling scheme. As a result, the quantity of signal paths used to communicate information between the buffer and the one or more memory dies while maintaining a same bit rate (e.g., data rate) across the memory device may be reduced, thereby mitigating the scaling constraints conventionally associated with gearing.

Features of the disclosure are initially described in the context of systems and dies as described with reference to FIGS. 1 through 3. Features of the disclosure are described in the context a circuit and signal diagrams as described with reference to FIGS. 4 and 5. These and other features of the disclosure are further illustrated by and described with reference to a flowchart that relates to buffer configurations for communications between memory dies and a host device as described with reference to FIG. 6.

FIG. 1 illustrates an example of a system 100 that supports buffer configurations for communications between memory dies and a host device in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device 110. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths).

In some examples, clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, DQ 190 may be operable to communicate one or more of data or control information between the host device 105 and the memory device 110. For example, the DQ 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel 115 may be ×4 (e.g., including four signal paths), ×8 (e.g., including eight signal paths), ×16 (including sixteen signal paths), etc.

In some examples, the one or more other channels 192 may include one or more error detection code (EDC) channels. The EDC channels may be operable to communicate error detection signals, such as checksums, to improve system reliability. An EDC channel may include any quantity of signal paths.

Signals communicated over the channels 115 may be modulated using one or more different modulation schemes. In some examples, a binary-symbol (or binary-level) modulation scheme may be used to modulate signals communicated between the host device 105 and the memory device 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some examples, a multi-symbol (or multi-level) modulation scheme may be used to modulate signals communicated between the host device 105 and the memory device 110. A multi-symbol modulation scheme may be an example of a M-ary modulation scheme where M is greater than or equal to three. Each symbol of a multi-symbol modulation scheme may be operable to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

The memory device 110 may include a buffer that facilitates communications between the memory device 110 and the host device 105. For example, one or more channels 115 (e.g., one or more CA channels 186, one or more DQ channels 190) may be routed through the buffer. For instance, communications between a given memory die 160 and the host device 105 over a given channel 115 may be routed through the buffer. The buffer may be configured to gear some communications between the memory device 110 and the host device 105 according to various gearing schemes (e.g., a 2:1 gearing scheme, a four-to-one (4:1) gearing scheme, etc.). For example, the buffer may be configured to implement a 2:1 gearing scheme in which information (e.g., data, access commands) is communicated between a given memory die 160 and the buffer at a first frequency and information is communicated between the buffer and the host device 105 at a second frequency that is double the first frequency.

In order to support enhanced flexibility of memory device scaling while supporting gearing, the buffer may be configured to implement various signaling schemes (e.g., modulation schemes) in conjunction with the gearing. For example, the buffer may include a first interface that is coupled with one or more memory dies 160 and a second interface that is coupled with the host device 105. The first interface may operate according to a first signaling scheme having a first quantity of voltage levels, and the second interface may operate according to a second signaling scheme having a second quantity of voltage levels that is less than the first quantity of voltage levels. For example, the first interface may communicate information with the one or more memory dies 160 according to a multi-level modulation scheme (e.g., a PAM4 scheme), and the second interface may communicate information with the host device 105 according to a binary-level modulation scheme (e.g., an NRZ scheme). As such, a symbol communicated via the first interface may represent more bits than a symbol communicated via the second interface (e.g., twice the quantity of bits, four times the quantity of bits, etc.). As a result, the memory device 110 may support gearing while reducing a quantity of signal paths used to communicate information between the buffer and the one or more memory dies 160 (e.g., including channels 115 between the buffer and the one or more memory dies 160 that have a same quantity of signal paths as channels 115 between the buffer and the host device 105). For example, because the information communicated via the first interface is communicated at a higher-level modulation scheme than the information communicated via the second interface, the buffer may communicate the information via the second interface at a higher frequency than the information communicated via the first interface while maintaining a same bit rate (e.g., data rate) over the channels 115 between the buffer and the one or more memory dies 160 and the channels 115 between the buffer and the host device 105.

It is noted that, in some examples, the techniques described herein are described with reference to a random access memory (RAM) system such as a dynamic RAM (DRAM) system, however, the techniques described herein may be adapted and applied to support such techniques within any memory system.

Figure 2:
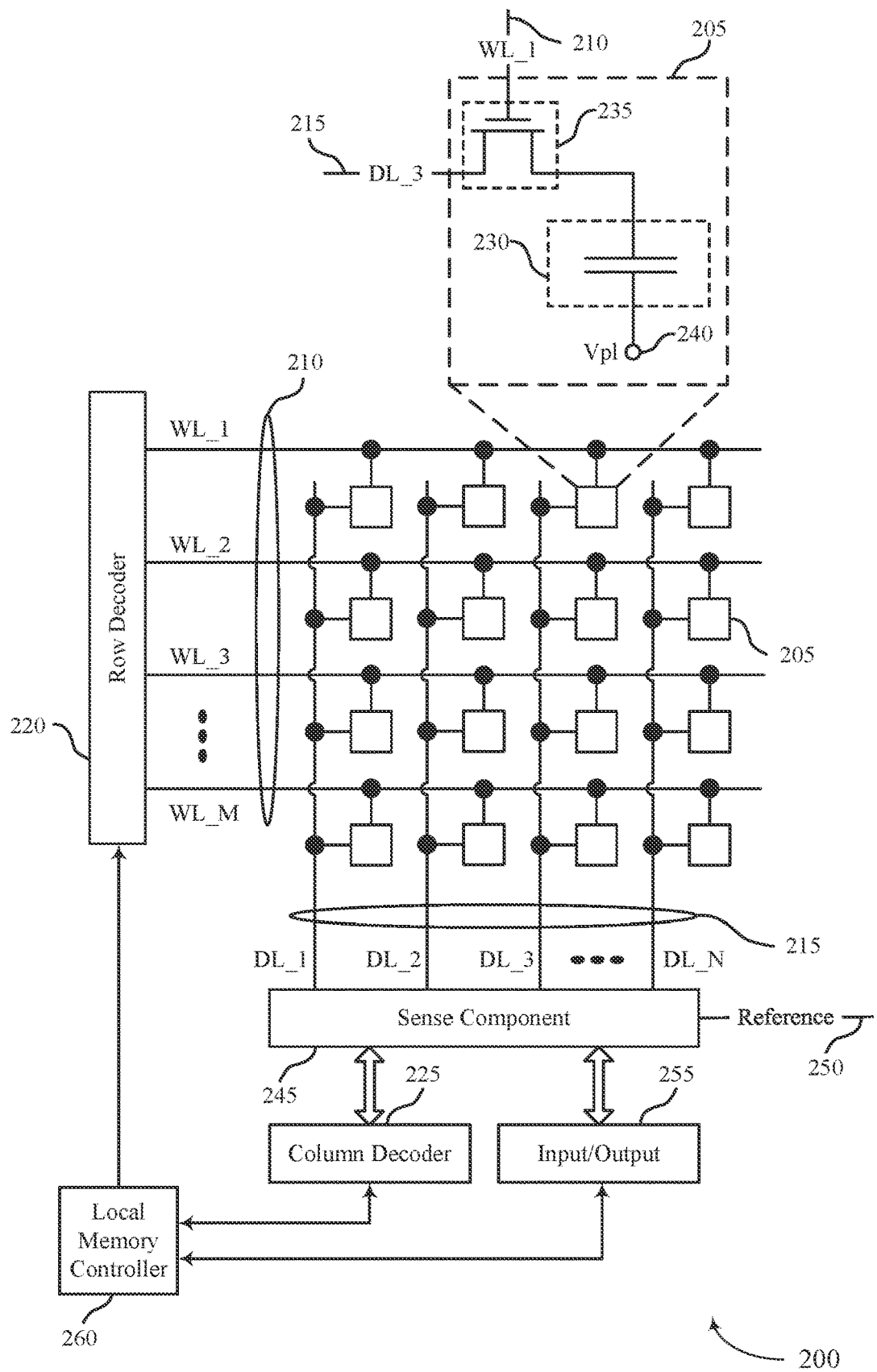
FIG. 2 illustrates an example of a memory die that supports buffer configurations for communications between memory dies and a host device in accordance with examples as disclosed herein.

FIG. 2 illustrates an example of a memory die 200 that supports buffer configurations for communications between memory dies and a host device in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss. It is noted that, although the example of FIG. 2 may describe a DRAM system or architecture, the techniques described herein may be adapted and applied to support such techniques within any memory system or architecture.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

At least some information (e.g., data, access commands) communicated to and from the memory cells 205 as a result of the access operations performed by the local memory controller 260 may be communicated via a buffer coupled with the memory die 200. The buffer may be configured to adjust a frequency and a signaling scheme (e.g., a modulation scheme) of the information communicated to and from the memory cells 205 compared to information communicated to and from a host device 105. For example, the buffer may receive information from and output information to the memory cells 205 at a first frequency and according to a first signaling scheme. Additionally, the buffer may receive information from and output information to the host device 105 at a second frequency higher than the first frequency and according to a second signaling scheme that is a lower level signaling scheme than the first signaling scheme (e.g., includes fewer voltage levels than are included in the first signaling scheme). That is, the buffer may convert information transmitted by the host device 105 to the memory die 200 (e.g., read commands, write commands, data associated with a write command, among other information transmitted by the host device 105) such that the information is transmitted by the host device 105 at the second frequency and according to the second signaling scheme and received at the memory die 200 (e.g., at the local memory controller 260) at the first frequency and according to the first signaling scheme. Further, the buffer may convert information transmitted by the memory die 200 to the host device 105 (e.g., data associated with a read command, among other information transmitted by the memory die 200) such that the information is transmitted by the memory die 200 at the first frequency and according to the first signaling scheme and received at the host device 105 at the second frequency and according to the second signaling scheme.

Figure 3:
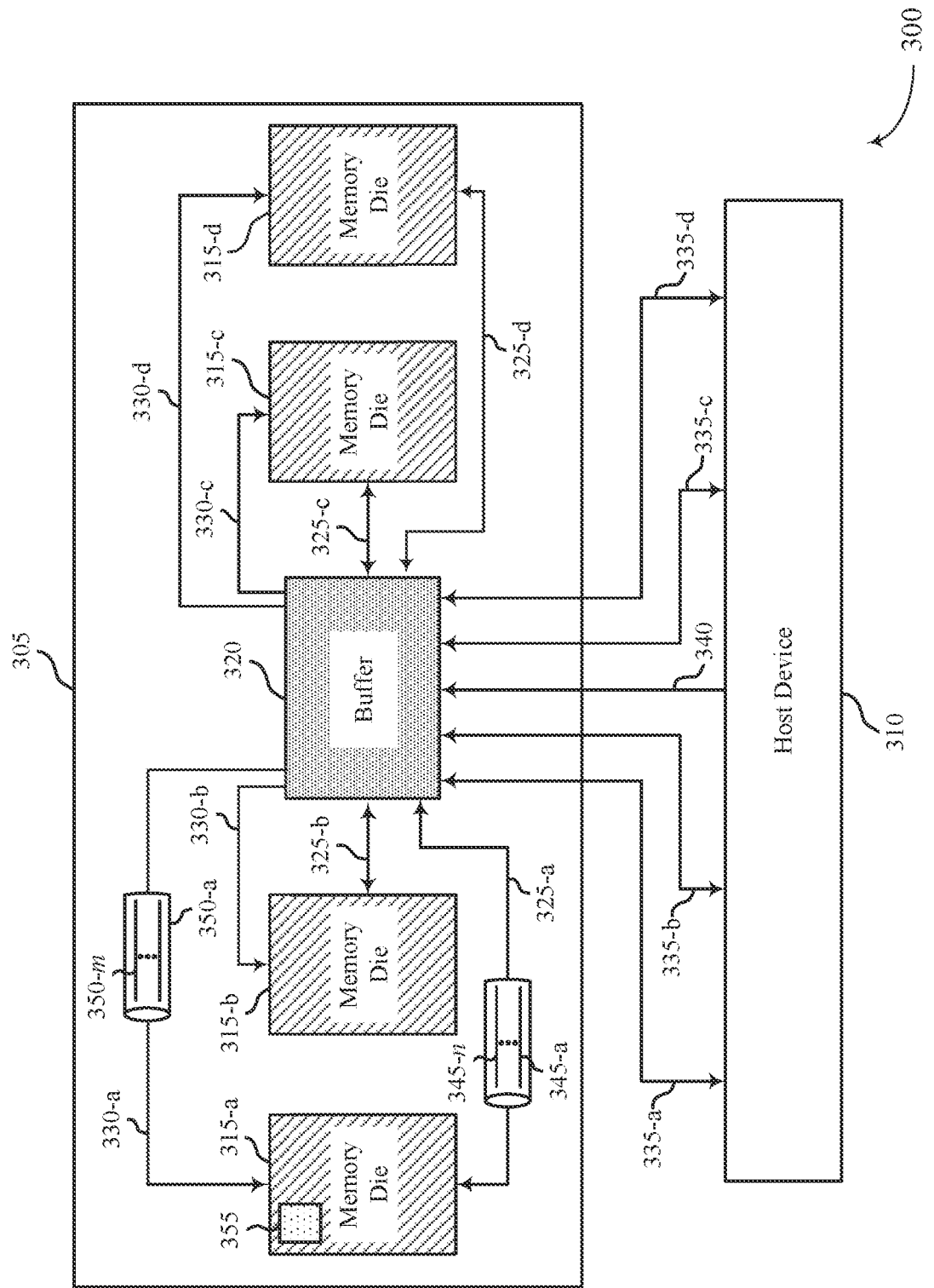
FIG. 3 illustrates an example of a system that supports buffer configurations for communications between memory dies and a host device in accordance with examples as disclosed herein.

FIG. 3 illustrates an example of a system 300 that supports buffer configurations for communications between memory dies and a host device in accordance with examples as disclosed herein. The system 300 may implement aspects of the system 100 and the memory die 200 or may be implemented by aspects of the system 100 and the memory die 200 described with reference to FIGS. 1 and 2, respectively. For example, the system 300 may include a memory device 305 and a host device 310, which may be respective examples of a memory device 110 and a host device 105 as described with reference to FIG. 1. Additionally, the memory device 305 may include one or more memory dies 315, which may be examples of a memory die 160 or a memory die 200 as described with reference to FIGS. 1 and 2, respectively. In some examples, the memory device 305 may be an example of a memory module such as a dual in-line memory module (DIMM) upon which the memory dies 315 are located. In some examples, the memory dies 315 may be examples of DRAM dies, although other types of memory may be supported by the memory dies 315 (e.g., static RAM (SRAM), ferroelectric RAM (FeRAM), flash memory, phase change memory (PCM), or self-selecting memory, among other types of memory). The system 300 may support the gearing of communications between the memory dies 315 and the host device 310 while supporting enhanced flexibility of scaling of the memory device 305.

In the example of FIG. 3, the memory device 305 may include a memory die 315-*a*, a memory die 315-*b*, a memory die 315-*c*, and a memory die 315-*d* (although any quantity of memory dies 315 may be included in and supported by the memory device 305). The memory device 305 may further include a buffer 320 (e.g., located on the DIMM) that supports the gearing of communications between the memory dies 315 and the host device 310. The buffer 320 may be coupled with the memory dies 315 via respective DQ channels 325 and respective CA channels 330, which may be respective examples of a DQ channel 190 and a CA channel 186 described with reference to FIG. 1. For example, the memory die 315-*a* may be coupled with the buffer 320 via a DQ channel 325-*a* and a CA channel 330-*a*, the memory die 315-*b* may be coupled with the buffer 320 via a DQ channel 325-*b* and a CA channel 330-*b*, the memory die 315-*c* may be coupled with the buffer 320 via a DQ channel 325-*c* and a CA channel 330-*c*, and the memory die 315-*d* may be coupled with the buffer 320 via a DQ channel 325-*d* and a CA channel 330-*d*. Additionally, the buffer 320 may be coupled with the host device 310 via DQ channels 335 and a CA channel 340 (which may be respective examples of a DQ channel 190 and a CA channel 186) corresponding to the DQ channels 325 and the CA channels 330. For example, the host device 310 may be coupled with the buffer 320 via a DQ channel 335-*a* corresponding to the DQ channel 325-*a*, a DQ channel 335-*b* corresponding to the DQ channel 335-*b*, a DQ channel 335-*c* corresponding to the DQ channel 325-*c*, a DQ channel 335-*d* corresponding to the DQ channel 335-*d*, and a CA channel 340 corresponding to the CA channels 330. For instance, data communicated between the memory die 315-*a* and the host device 310 may be communicated over the DQ channel 325-*a* and the DQ channel 335-*a*, and access commands transmitted to the memory die 315-*a* may be sent over the CA channel 340 and the CA channel 330-*a*.

The buffer 320 may gear communications between the memory dies 315 and the host device 310. For example, the buffer 320 and the memory dies 315 may communicate data over the DQ channels 325 and access commands over the CA channels 330 at a first frequency (e.g., a first clock rate), while the buffer 320 and the host device 310 may communicate over the DQ channels 335 and access commands over the CA channel 340 at a second frequency (e.g., a second clock rate) that is higher than the first frequency. For instance, in a 2:1 gearing scheme, the second frequency may be double the first frequency; in a 4:1 gearing scheme, the second frequency may be quadruple the first frequency; and so on. In other words, the buffer 320 may increase a frequency of a signal transmitted from the memory dies 315 to the host device 310 and may decrease a frequency of a signal transmitted from the host device 310 to a memory die 315. In this way, the memory device 305 may increase a data output to the host device 310 while being able to operate the memory dies 315 at a lower frequency.

However, gearing typically results in scaling constraints for a size of the memory device. In some cases, the size (e.g., physical size) of the memory device 305 may be increased in order to support the gearing. For example, to compensate for the increased frequency at which information is communicated between the buffer 320 and the host device 310, an increased quantity of bits may be communicated between the memory dies 315 and the buffer 320 at each clock cycle. For instance, to support 2:1 gearing, double the quantity of bits may be communicated between the memory dies 315 and the buffer 320 during each clock cycle so that the clock rate between the buffer 320 and the host device 310 may be doubled while maintaining a same bit rate (e.g., data rate). To support the increased quantity of communicated bits, in some cases, the memory device 305 may include an increased quantity of signal paths between the buffer 320 and the memory dies 315. For example, the memory device 305 may include additional memory dies 315 routed to the buffer 320 (e.g., that each include a first quantity of pins or pads), thereby increasing a size of the memory device 305. Alternatively, in some cases, the memory device 305 may include additional DQ channels 325 and CA channels 330 routed to each memory die 315, or a width of the DQ channels 325 and CA channels 330 routed to each memory die 315 (e.g., a quantity of signal paths included in each DQ channel 325 and CA channel 330) may be increased. To support the additional or wider channels, additional pins or pads may be added to each memory die 315 such that each memory die 315 includes a second quantity of pins or pads greater than the first quantity of pins or pads. As a result, a size (e.g., a physical size) of each memory die 315 may be increased to accommodate the additional pins or pads, thereby increasing a size or cost of the memory device 305.

To enhance flexibility of scaling of the memory device 305 while supporting gearing communications between the memory dies 315 and the host device 310, the buffer 320 may be configured to adjust (e.g., modify, change) a modulation scheme of signals communicated between the memory dies 315 and the host device 310 in conjunction with performing the gearing. For example, the buffer 320 and the memory dies 315 may communicate data and access commands according to a first modulation scheme including a first quantity of voltage levels, and the buffer 320 and the host device 310 may communicate data and access commands according to a second modulation scheme including a second quantity of voltage levels that is less than the first quantity of voltage levels. For instance, the memory dies 315 may be configured to output (e.g., transmit) data to the buffer 320 at the first frequency and according to the first modulation scheme, and the buffer 320 may be configured to output (e.g., transmit, forward) the data received from the memory dies 315 to the host device 310 at the second frequency and according to the second modulation scheme. Additionally, the host device 310 may be configured to output data and access commands to the buffer 320 at the second frequency and according to the second modulation scheme, and the buffer 320 may be configured to output (e.g., transmit, forward) the data and access commands received from the host device 310 to the memory dies 315 at the first frequency and according to the first modulation scheme.

For example, the host device 310 may transmit, to the buffer 320, an access command (e.g., a read command, a write command) intended for the memory die 315-*b* over the CA channel 340 at the second frequency and according to the second modulation scheme. In some cases, if the access command is a write command, the host device 310 may additionally transmit, to the buffer 320, data associated with the write command over the DQ channel 335-*b* at the second frequency and according to the second modulation scheme. The buffer 320 may adjust the frequency and the modulation scheme from the second frequency and the second modulation scheme to the first frequency and first modulation scheme and may output, to the memory die 315-*b*, the access command (e.g., and the data) over the CA channel 330-*b* (e.g., and the DQ channel 325-*b*) at the first frequency and according to the first modulation scheme. In some cases, if the access command is a read command, the memory die 315-*b* may retrieve data associated with the read command and may output the data to the buffer 320 at the first frequency and according to the first modulation scheme. The buffer 320 may adjust the frequency and the modulation scheme from first frequency and the first modulation scheme to the second frequency and second modulation scheme and may output, to the host device 310, the data over the DQ channel 335-*b* at the second frequency and according to the second modulation scheme.

In some examples, the first modulation scheme may be a multi-level modulation scheme, such as a PAM4 scheme, a PAM8 scheme, or a PAM16 scheme, among other multi-level modulation schemes. In some examples, the second modulation scheme may be a binary-level modulation scheme, such as an NRZ scheme or a PAM2 scheme, among other binary-level modulation schemes, or may be a multi-level modulation scheme that includes fewer levels than the first modulation scheme. Based on communicating according to the first modulation scheme and the second modulation scheme, the buffer 320 may gear the communications between the memory dies 315 and the host device 310 while maintaining a same bit rate (e.g., data rate) behind the buffer 320 (e.g., between the buffer 320 and the memory dies 315) and in front of the buffer 320 (e.g., between the buffer 320 and the host device 310).

Based on using the buffer 320 to adjust signaling between the first modulation scheme and the second modulation scheme in conjunction with performing gearing, flexibility of the scaling of the memory device 305 may be enhanced. For example, each DQ channel 325 and 335 may include a quantity of signal paths 345, and each CA channel 330 and 340 may include a quantity of signal paths 350. For instance, the DQ channel 325-*a* may include a signal path 345-*a* through a signal path 345-*n*, and the CA channel 330-*a* may include a signal path 350-*a* through a signal path 350-*m*. In some examples, each of the DQ channels 325 and 335 may be ×16 channels (e.g., may include sixteen signal paths 345). Accordingly, in the example of FIG. 3, the memory device 305 may include 64 signal paths 345 (e.g., 64 DQ signal paths) behind the buffer 320 and 64 signal paths 345 in front of the buffer 320. It is noted, however, that other channel widths may be supported, such as the channels being ×4 channels, ×8 channels, ×32 channels, etc. In some examples, each of the CA channels 330 and 340 may be ×16 channels (e.g., may include sixteen signal paths 350). In some other examples, the CA channels 330 may include different quantities of signal paths 350, and the quantity of signal paths 350 may depend on a memory size (e.g., quantity of memory addresses) of memory device 305.

In some examples, based on adjusting between the first modulation scheme and the second modulation scheme, each DQ channel 325 and 335 may include a same quantity of signal paths 345 and each CA channel 330 may include a same quantity of signal paths 350 as are included in the CA channel 340. For example, if the first modulation scheme is a PAM4 scheme and the second modulation scheme is an NRZ scheme, a signal communicated between the memory dies 315 and the buffer 320 may represent double the quantity of bits compared to a signal communicated between the buffer 320 and the host device 310 (e.g., two bits compared to one bit). Accordingly, the same quantity of signal paths 345 and the same quantity of signal paths 350 may be used to communicate a sufficient quantity of bits to support, for example, 2:1 gearing by the buffer 320. Further, a first quantity of DQ channels 325 and a second quantity of DQ channels 335 may be the same. Thus, a physical size of each memory die 315 and the total size or cost of the memory device 305 may be reduced, for example, by including memory dies 315 that include the first quantity of pins or pads.

In some examples, based on adjusting between the first modulation scheme and the second modulation scheme, each DQ channel 325 and CA channel 330 may respectively include a smaller quantity of signal paths 345 and signal paths 350 as are included in corresponding DQ channels 335 and the CA channel 340. For example, if the first modulation scheme is a PAM16 scheme and the second modulation scheme is an NRZ scheme, a signal communicated between the memory dies 315 and the buffer 320 may represent quadruple the quantity of bits compared to a signal communicated between the buffer 320 and the host device 310 (e.g., four bits compared to one bit). Accordingly, half of a quantity of signal paths 345 included in a DQ channel 335 may be included in a DQ channel 325 and half of a quantity of signal paths 350 included in the CA channel 340 may be included in a CA channel 330 to communicate a sufficient quantity of bits to support, for example, 2:1 gearing by the buffer 320. Thus, a physical size of each memory die 315 and the total size or cost of the memory device 305 may be reduced, for example, by including memory dies 315 that include a third quantity of pins or pads that is less than the first quantity of pins or pads.

In some examples, each DQ channel 325 and CA channel 330 may include a greater quantity of signal paths 345 and signal paths 350, respectively, as are included in corresponding DQ channels 335 and the CA channel 340. For example, if the first modulation scheme is a PAM8 scheme and the second modulation scheme is a PAM4 scheme, a signal communicated between the memory dies 315 and the buffer 320 may represent more bits than to a signal communicated between the buffer 320 and the host device 310 (e.g., three bits compared to two bits). Accordingly, a DQ channel 325 may include 1.5 times the quantity of signals paths 345 included in a DQ channel 335 and a CA channel 330 may include 1.5 times the quantity of signals paths 350 included in the CA channel 340 to communicate a sufficient quantity of bits to support, for example, 2:1 gearing by the buffer 320. Here, a physical size of each memory die 315 and the total size of the memory device 305 may be reduced compared to if the buffer 320 is configured to use a same modulation scheme to communicate with both the memory dies 315 and the host device 310, for example, by including memory dies 315 that include a fourth quantity of pins or pads that is less than the second quantity of pins or pads.

In some examples, one or more of the memory die 315 may include a mode register 355 configured to indicate an operating mode of a respective memory die 315. For example, the memory die 315-a may include the mode register 355, and the mode register 355 may indicate whether the memory die 315-a is configured to communicate with the buffer 320 according to the first modulation scheme (e.g., and at the first frequency) or the second modulation scheme (e.g., and at the second frequency). In the example of FIG. 3, the mode register 355 may be set such that the memory die 315-a and the buffer 320 are configured to communicate according to the first modulation scheme and at the first frequency. In some examples, if the mode register 355 is set such that the memory dies 315-a and the buffer 320 communicate according to the second modulation scheme (e.g., according to the same modulation scheme as communications between the buffer 320 and the host device 310), the buffer 320 may be configured to not gear the communications between the memory die 315-a and the host device 310 and may instead pass the communications without frequency or modulation scheme adjustments.

In some examples, the mode register 355 may be set based on a capability of the memory die 315-a. For example, the memory die 315-a may have the capability to communicate according to the first modulation scheme or the second modulation scheme. Alternatively, the memory die 315-a may have the capability to switch between communicating according to the first modulation scheme and the second modulation scheme. Accordingly, the mode register 355 may be statically or dynamically set based on the capability of the memory die 315-a. In some examples, the mode register 355 may be set in accordance with a serial presence detect (SPD) device located on the memory device 305 (not shown). For example, the host device 310 may determine the capability of the memory die 315-a by reading the SPD device (e.g., an electrically erasable programmable read-only memory (EEPROM) device) that stores memory die capabilities, memory die operating parameters, memory device capabilities, memory device operating parameters, and the like. Based on determining the capability of the memory die 315-a, the host device 310 may indicate a setting of the mode register 355 (e.g., indicated directly from the host device 310 or via a controller of the memory device 305 such as device memory controller 155, or a local memory controller 165, 260), and the memory die 315-a may operate in accordance with the indicated setting of the mode register 355.

Figure 4:
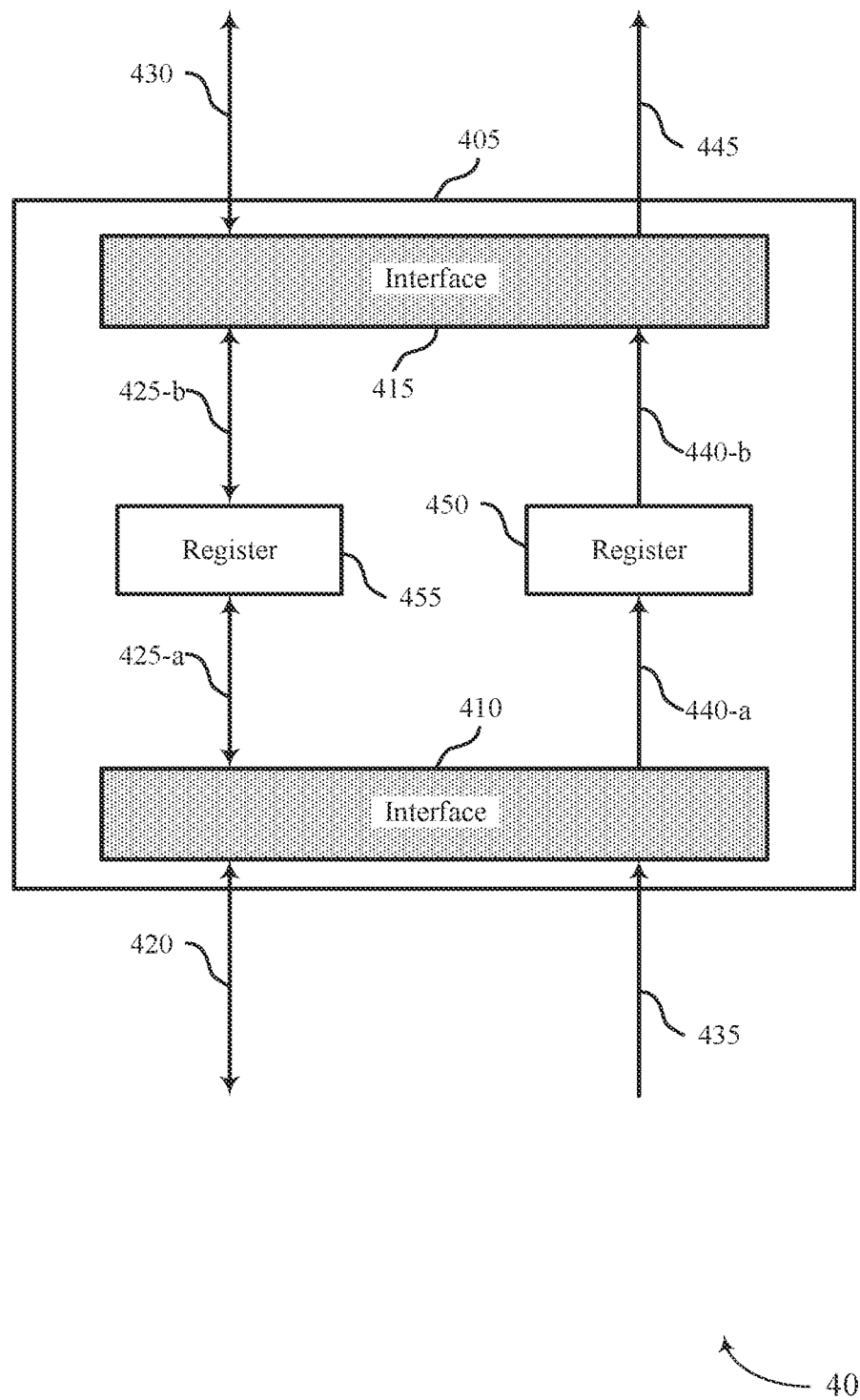
FIG. 4 illustrates an example of a subsystem that supports buffer configurations for communications between memory dies and a host device in accordance with examples as disclosed herein.

FIG. 4 illustrates an example of a subsystem 400 that supports buffer configurations for communications between memory dies and a host device in accordance with examples as disclosed herein. The subsystem 400 may implement aspects of the system 300 or may be implemented by aspects of the system 300 described with reference to FIG. 3. For example, the subsystem 400 may include a buffer 405, which may be an example of a buffer 320 described with reference to FIG. 3. The buffer 405 may support the gearing of communications between a memory die and a host device while supporting enhanced flexibility of scaling of the memory device.

The buffer 405 may include an interface 410 via which the buffer 405 communicates with a host device (e.g., a host device 105, a host device 310) and an interface 415 via which the buffer 405 communicates with a set of memory dies (e.g., memory dies 160, memory dies 200, memory dies 315). For example, the buffer 405 may be coupled with the host device using the interface 410 and may be coupled with the set of memory dies using the interface 415. The interface 410 may communicate information with the host device over various subchannels. For example, the interface 410 may output data to and receive data from the host device over one or more subchannels 420, which may be examples of a DQ channel 190 or a DQ channel 335. Additionally, the interface 410 may receive access commands from the host device over a CA channel 435, which may be an example of a CA channel 186 or a CA channel 340. The interface 415 may communicate information with the set of memory dies over various subchannels. For example, the interface 415 may output data to and receive data from the set of memory dies over a set of subchannels 430, which may be examples of a DQ channel 190 or a DQ channel 325. Additionally, the interface 415 may output or transmit access commands to the set of memory dies over a set of CA channels 445, which may be examples of a CA channel 186 or a CA channel 330. In some examples, a single CA channel 445 may be routed to the set of memory dies (e.g., to each of the memory dies). The interface 410 and the interface 415 may communicate over various signal paths included in the buffer 405. For example, the interface 410 and the interface 415 may bi-directionally communicate data over one or more subchannels 425 that each correspond to a subchannel 420 and a subchannel 430. Additionally, the interface 410 may unidirectionally communicate access commands to the interface 415 over one or more CA channels 440 that each correspond to a CA channel 435 and a CA channel 445.

In some examples, each memory die of the set of memory dies may be coupled with the interface 415 over a respective subchannel 430 and a CA channel 445 with each subchannel 430 and CA channel 445 comprising a respective quantity of signal paths. As a result, the interface 415 may include a quantity of signal paths equal to a product of the respective quantity of signal paths included in each subchannel 430 and CA channel 445 and a quantity of the set of memory dies. That is, the interface 415 may include a quantity of data signal paths equal to a product of the quantity of the set of memory dies and a quantity of signal paths in each of the subchannels 430, and may include a quantity of CA signal paths equal to a quantity of signal paths in CA channels 445.

The buffer 405 may be configured to gear communications between the host device and the set of memory dies while improving a scaling of a memory device (e.g., a DIMM) upon which the buffer 405 and the set of memory dies are located. For example, the interface 415 may be configured to operate at a first frequency and according to a first signaling scheme having a first quantity of voltages, and the interface 410 may be configured to operate at a second frequency and according to a second signaling scheme having a second quantity of voltages, where the first frequency is lower than the second frequency and the second quantity of voltages is less than the first quantity of voltages. Accordingly, the interface 415 may receive and transmit signals according to the first signaling scheme and at the first frequency (e.g., according to a signaling diagram 500-*a* described with reference to FIG. 5), and the interface 410 may receive and transmit signals according to the second signaling scheme and at the second frequency (e.g., according to a signaling diagram 500-*b* described with reference to FIG. 5). Based on communicating according to the respective signaling schemes and respective frequencies, a data rate (e.g., or a bit rate) at which the interface 410 and the interface 415 communicate signals may be the same. For example, despite the first frequency being less than the second frequency, because the interface 415 may output and receive signals according to the first signaling scheme, the interface 415 may communicate more bits per clock cycle than the interface 410, which may compensate for the reduced frequency (e.g., clock rate) at which the interface 415 operates. As a result, the data rate may be the same.

The buffer 405 may adjust signaling received at the interface 415 and the interface 410 between the first frequency and the second frequency and between the first modulation scheme and the second modulation scheme. For example, signaling received at the interface 410 that is to be output from the interface 415 may be adjusted from the second frequency and the second signaling scheme to the first frequency and the first signaling scheme, and vice versa. In some examples, the buffer 405 may include one or more registers 455 and one or more registers 450 to support such adjustments. For example, a register 455 may be coupled with the interface 410 via a subchannel 425-*a* and may be coupled with the interface 415 via a subchannel 425-*b*. The register 455 may be a bi-directional data register that may temporarily store data that is communicated between the interface 410 and the interface 415. For example, the interface 410 may output data received from the host device to the register 455 (e.g., at the second frequency and according to the second signaling scheme) for temporary storage in the register 455. The interface 415 may retrieve the data from the register 455 and may output the data to a corresponding memory die. In some examples, the register 455 may output the data to the interface 415 at the first frequency and according to the first signaling scheme, and the interface 415 may forward the data to the corresponding memory die. In some examples, the register 455 may output the data to the interface 415 at the second frequency and according to the second signaling scheme, and the interface 415 may perform the adjustment to the first frequency and first signaling scheme before outputting the data to the corresponding memory die. Additionally, the interface 415 may output data received from a memory die to the register 455 (e.g., at the first frequency and according to the first signaling scheme) for temporary storage in the register 455. The interface 410 may retrieve the data from the register 455 and may output the data to the host device. In some examples, the register 455 may output the data to the interface 410 at the second frequency and according to the second signaling scheme, and the interface 410 may forward the data to the host device. In some examples, the register 455 may output the data to the interface 410 at the first frequency and according to the first signaling scheme, and the interface 410 may perform the adjustment to the second frequency and second signaling scheme before outputting the data to the host device.

Additionally, or alternatively, a register 450 may be coupled with the interface 410 via a CA channel 440-*a* and may be coupled with the interface 415 via a CA channel 440-*b*. The register 450 may be a unidirectional command register that may temporarily store access commands that are communicated from the interface 410 to the interface 415. For example, the interface 410 may output an access command received from the host device to the register 450 (e.g., at the second frequency and according to the second signaling scheme) for temporary storage in the register 450. The interface 415 may retrieve the access command from the register 450 and may output the access command to a corresponding memory die. In some examples, the register 450 may output the access command to the interface 415 at the first frequency and according to the first signaling scheme, and the interface 415 may forward the access command to the corresponding memory die. In some examples, the register 450 may output the access command to the interface 415 at the second frequency and according to the second signaling scheme, and the interface 415 may perform the adjustment to the first frequency and first signaling scheme before outputting the access command to the corresponding memory die.

In some examples, the subchannel 430 and the CA channel 445 may be unterminated subchannels. That is, signal paths included in the subchannel 430 and the CA channel 445 may be unterminated. In some other examples, the subchannel 430 and the CA channel 445 may be lightly terminated subchannels. That is, signal paths included in the subchannel 430 and the CA channel 445 may be terminated using respective components (e.g., resistors or traces having various lengths, among other components) having a first impedance that is greater than a second impedance of the signal path.

In some examples, the buffer 405, or various components thereof, may be an example of means for performing various aspects of buffer configurations for communications between memory dies and a host device as described herein. For example, the interface 415 may be configured as or otherwise support a means for receiving, from a memory die at the buffer 405, data communicated at a second frequency and according to a second signaling scheme including a second quantity of voltage levels. The interface 410 may be configured as or otherwise support a means for transmitting, from the buffer 405 to the host device, the data at a first frequency higher than the second frequency and according to a first signaling scheme including a first quantity of voltage levels, the first quantity of voltage levels being less than the second quantity of voltage levels.

In some examples, the interface 410 may be configured as or otherwise support a means for receiving, from the host device at the buffer 405, second data communicated at the first frequency and according to the first signaling scheme. In some examples, the interface 415 may be configured as or otherwise support a means for transmitting, from the buffer 405 to the memory die, the second data at the second frequency and according to the second signaling scheme.

In some examples, the interface 410 may be configured as or otherwise support a means for receiving, from the host device at the buffer 405, signaling indicative of an access command associated with the memory die at the first frequency and according to the first signaling scheme. In some examples, the interface 415 may be configured as or otherwise support a means for transmitting, from the buffer 405 to the memory die, the signaling indicative of the access command at the second frequency and according to the second signaling scheme.

In some examples, the interface 410 may be configured as or otherwise support a means for transmitting the data to the host device at a same data rate at which the data is received from the memory die based on receiving the data at the second frequency and according to the second signaling scheme.

In some examples, the second frequency is double the first frequency.

Figure 5:
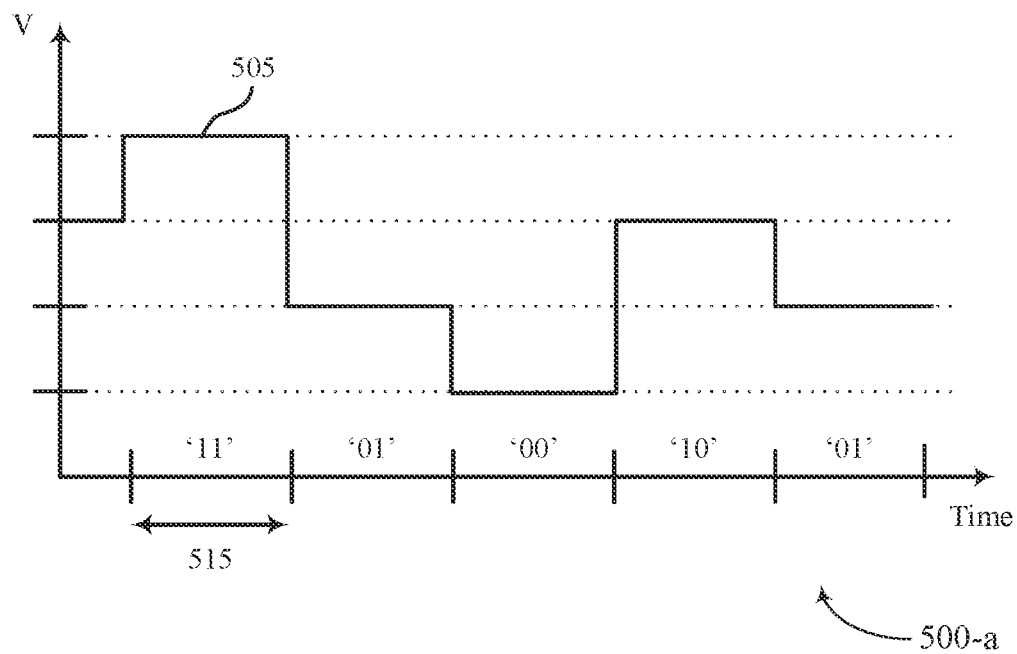
FIG. 5 illustrates an example of signal diagrams that support buffer configurations for communications between memory dies and a host device in accordance with examples as disclosed herein.
Figure 5:
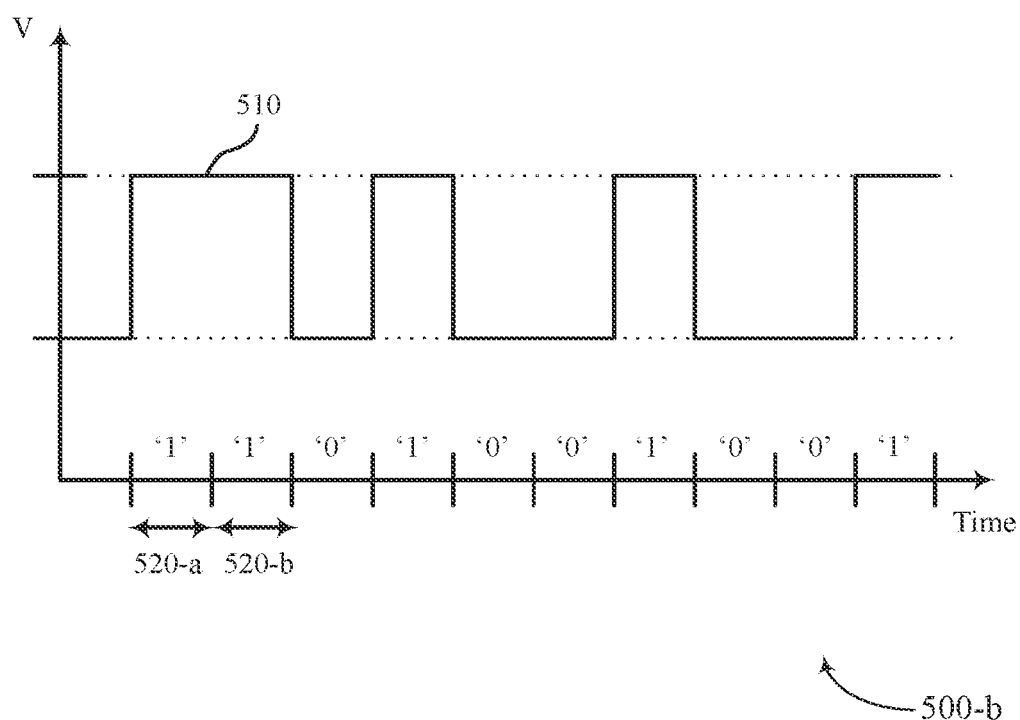

FIG. 5 illustrates examples of signaling diagrams 500 that support buffer configurations for communications between memory dies and a host device in accordance with examples as disclosed herein. The signaling diagrams 500 may be implemented by devices of a system or a subsystem described herein. For example, the signaling diagrams 500 may be implemented by a host device, a memory die, or a buffer as described herein, including with reference to FIGS. 1-4.

FIG. 5 depicts a signaling diagram 500-a and signaling diagram 500-b. The signaling diagram 500-a represents a signal 505 that is modulated according to a multi-level modulation scheme, such as a PAM4 scheme. An amplitude of the signal 505, depicted as voltage, is shown varying in time The signal 505 may be communicated at a first frequency, which may correspond to a first clock rate. A pulse duration 515 (e.g., a symbol duration) of the of the signal 505 may be based on the first frequency, and a single symbol may be communicated during a single pulse duration 515. In the example of the signaling diagram 500-a, each symbol may represent two bits of data, for example, based on being modulated according to the PAM4 scheme. Accordingly, starting with the trailing pulse (e.g., reading left to right), the signal 505 may represent the data sequence: 1101001001, which may be communicated over five clock cycles.

The signaling diagram 500-b represents a signal 510 that is modulated according to a binary-level modulation scheme, such as an NRZ scheme. An amplitude of the signal 510, depicted as voltage, is shown varying in time The signal 510 may be communicated at a second frequency, which may correspond to a second clock rate. A pulse duration 520 (e.g., a symbol duration) of the of the signal 510 may be based on the first frequency, and a single symbol may be communicated during a single pulse duration 520. In the example of the signaling diagram 500-b, the second frequency may be double the first frequency (e.g., the second clock rate may be double the first clock rate). Accordingly, a pulse duration 520 may be half of a pulse duration 515. That is, for each pulse duration 515 of the signal 505, the signal 510 may include two pulse durations 520 (e.g., a pulse duration 520-a and a pulse duration 520-b). In the example of the signaling diagram 500-b, each symbol may represent one bit of data, for example, based on being modulated according to the NRZ scheme. Accordingly, starting with the trailing pulse (e.g., reading left to right), the signal 510 may represent the data sequence: 1101001001, which may be communicated over ten clock cycles.

The signal 505 and the signal 510 may be communicated over a same time period and have a same data rate. For example, because the second clock rate is double the first clock rate, the five clock cycle duration of the signal 505 may span a same amount of time as the ten clock cycle duration of the signal 510. Additionally, because each symbol of the signal 505 represents twice the amount of bits as each symbol of the signal 510, the signal 505 and the signal 510 may each communicate a same quantity of bits over their respective durations.

In some examples, a buffer in a memory device may communicate signals with memory dies of the memory device in accordance with the signaling diagram 500-a. Additionally, the buffer may communicate signals with a host device in accordance with the signaling diagram 500-b. Accordingly, the buffer may gear signals communicated between the memory dies and the host device between the first frequency and the second frequency, while maintaining a same data rate.

Figure 6:
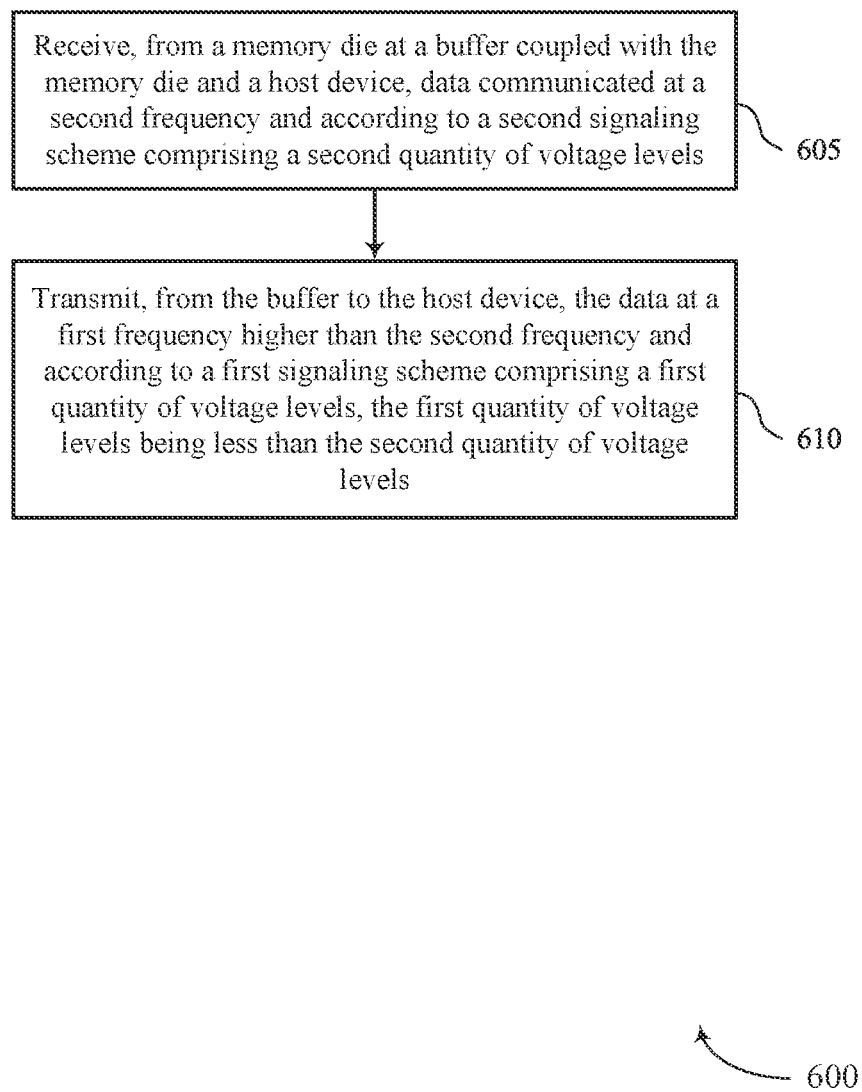
FIG. 6 shows a flowchart illustrating a method or methods that support buffer configurations for communications between memory dies and a host device in accordance with examples as disclosed herein.

FIG. 6 shows a flowchart illustrating a method 600 that supports buffer configurations for communications between memory dies and a host device in accordance with examples as disclosed herein. The operations of method 600 may be implemented by a memory device or its components as described herein. For example, the operations of method 600 may be performed by a buffer included in a memory device as described with reference to FIGS. 1 through 5. In some examples, a buffer may execute a set of instructions to control the functional elements of the device to perform the described functions. Additionally or alternatively, the buffer may perform aspects of the described functions using special-purpose hardware.

At 605, the method may include receiving, from a memory die at a buffer coupled with the memory die and a host device, data communicated at a second frequency and according to a second signaling scheme including a second quantity of voltage levels. The operations of 605 may be performed in accordance with examples as disclosed with reference to FIGS. 3 through 5.

At 610, the method may include transmitting, from the buffer to the host device, the data at a first frequency higher than the second frequency and according to a first signaling scheme including a first quantity of voltage levels, the first quantity of voltage levels being less than the second quantity of voltage levels. The operations of 610 may be performed in accordance with examples as disclosed with reference to FIGS. 3 through 5.

In some examples, an apparatus as described herein may perform a method or methods, such as the method 600. The apparatus may include, features, circuitry, logic, means, or instructions (e.g., a non-transitory computer-readable medium storing instructions executable by a processor), or any combination thereof for performing the following aspects of the present disclosure:

Aspect 1: The apparatus, including features, circuitry, logic, means, or instructions, or any combination thereof for receiving, from a memory die at a buffer coupled with the memory die and a host device, data communicated at a second frequency and according to a second signaling scheme including a second quantity of voltage levels and transmitting, from the buffer to the host device, the data at a first frequency higher than the second frequency and according to a first signaling scheme including a first quantity of voltage levels, the first quantity of voltage levels being less than the second quantity of voltage levels.

Aspect 2: The apparatus of aspect 1, further including operations, features, circuitry, logic, means, or instructions, or any combination thereof for receiving, from the host device at the buffer, second data communicated at the first frequency and according to the first signaling scheme and transmitting, from the buffer to the memory die, the second data at the second frequency and according to the second signaling scheme.

Aspect 3: The apparatus of any of aspects 1 through 2, further including operations, features, circuitry, logic, means, or instructions, or any combination thereof for receiving, from the host device at the buffer, signaling indicative of an access command associated with the memory die at the first frequency and according to the first signaling scheme and transmitting, from the buffer to the memory die, the signaling indicative of the access command at the second frequency and according to the second signaling scheme.

Aspect 4: The apparatus of any of aspects 1 through 3, further including operations, features, circuitry, logic, means, or instructions, or any combination thereof for transmitting the data to the host device at a same data rate at which the data is received from the memory die based at least in part on receiving the data at the second frequency and according to the second signaling scheme.

Aspect 5: The apparatus of any of aspects 1 through 4, where the second frequency is double the first frequency.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 6: An apparatus, including: a buffer including a first interface and a second interface, the first interface configured to be coupled with a host device and the second interface configured to be coupled with one or more memory dies, the buffer configured to: receive, at the first interface and from the host device, data communicated at a first frequency and according to a first signaling scheme including a first quantity of voltage levels; and output, from the second interface to a memory die of the one or more memory dies, the data at a second frequency lower than the first frequency and according to a second signaling scheme including a second quantity of voltage levels, where the second quantity of voltage levels is greater than the first quantity of voltage levels.

Aspect 7: The apparatus of aspect 6, where the buffer is further configured to: receive, at the second interface and from the memory die, second data communicated at the second frequency and according the second signaling scheme; and output, from the first interface to the host device, the second data at the first frequency and according to the first signaling scheme.

Aspect 8: The apparatus of any of aspects 6 through 7, where the buffer is further configured to: receive, at the first interface and from the host device, signaling indicative of an access command associated with the memory die at the first frequency and according to the first signaling scheme: and output, from the second interface to the memory die, the signaling indicative of the access command at the second frequency and according to the second signaling scheme.

Aspect 9: The apparatus of any of aspects 6 through 8, where: the data is received over a first subchannel between the buffer and the host device and output over a second subchannel between the buffer and the memory die, and each of the first subchannel and the second subchannel include a same number of signal paths.

Aspect 10: The apparatus of any of aspects 6 through 9, where the buffer is further configured to: output the data at a same data rate at which the data is received based at least in part on outputting the data at the second frequency and according to the second signaling scheme.

Aspect 11: The apparatus of any of aspects 6 through 10, where the first frequency is double the second frequency.

A system is described. The following provides an overview of aspects of the system as described herein:

Aspect 12: A system, including: a set of memory dies located on a memory module: and a buffer located on the memory module and including a first interface and a second interface, the first interface configured to be coupled with a host device and the second interface configured to be coupled with the set of memory dies, where a memory die of the set of memory dies is configured to output data to the second interface of the buffer at a second frequency and according to a second signaling scheme including a second quantity of voltage levels, and where the buffer is configured to output, from the first interface to the host device, the data at a first frequency higher than the second frequency and according to a first signaling scheme including a first quantity of voltage levels, where the first quantity of voltage levels is less than the second quantity of voltage levels.

Aspect 13: The system of aspect 12, where the buffer is further configured to: receive, at the first interface and from the host device, second data communicated at the second frequency and according to the first signaling scheme; and output, from the first interface to the memory die, the second data at the second frequency and according to the second signaling scheme.

Aspect 14: The system of any of aspects 12 through 13, where the buffer is further configured to: receive, at the first interface and from the host device, signaling indicative of an access command associated with the memory die at the first frequency and according to the first signaling scheme; and output, from the second interface to the memory die, the signaling indicative of the access command at the second frequency and according to the second signaling scheme.

Aspect 15: The system of any of aspects 12 through 14, where: each memory die of the set of memory dies is coupled with the second interface over a subchannel, each subchannel including a first quantity of signal paths between the second interface and a respective memory die, and the first interface includes a second quantity of signal paths equal to a product of the first quantity of signal paths and a quantity of the set of memory dies.

Aspect 16: The system of any of aspects 12 through 15, wherein the memory die of the set of memory dies comprises a mode register configured to indicate whether the memory die is configured to communicate with the buffer according to the second signaling scheme or according to the first signaling scheme.

Aspect 17: The system of any of aspects 12 through 16, where the buffer is further configured to: output the data from the first interface at a same data rate at which the memory die is configured to output the data to the second interface based at least in part on receiving the data at the second interface at the second frequency and according to the second signaling scheme.

Aspect 18: The system of any of aspects 12 through 17, where the second frequency is double the first frequency.

Aspect 19: The system of any of aspects 12 through 18, where the second interface is configured to be coupled with the set of memory dies via unterminated subchannels or via subchannels that are terminated using respective components having a first impedance that is greater than a second impedance of the subchannels.

A system is described. The following provides an overview of aspects of the system as described herein:

Aspect 20: A system, including: a set of memory dies located on a memory module; and a buffer located on the memory module and including a first interface and a second interface, the first interface configured to be coupled with a host device and the second interface configured to be coupled with the set of memory dies over a quantity of subchannels, the quantity of subchannels being the same as a quantity of memory dies of the set of memory dies, and where the second interface is configured to communicate data with the set of memory dies at a first frequency that is half of a second frequency at which the first interface is configured to communicate the data with the host device.

Aspect 21: The system of aspect 20, where the second interface is configured to communicate the data with the set of memory dies at a same data rate at which the first interface is configured to communicate the data with the host device based at least in part on the second interface being configured to communicate the data according to a second signaling scheme including a second quantity of voltage levels and the first interface being configured to communicate the data according to a first signaling scheme including a first quantity of voltage levels that is lower than the second quantity of voltage levels.

Aspect 22: The system of aspect 21, where: the first signaling scheme has two voltage levels, and the second signaling scheme has three or more voltage levels.

Aspect 23: The system of any of aspects 21 through 22, wherein: a memory die of the set of memory dies comprises a mode register configured to indicate whether the memory die is configured to communicate the data with the second interface according to the second signaling scheme or according to the first signaling scheme, and the second interface is configured to communicate the data with the memory die at the first frequency based at least in part on the mode register indicating for the memory die to communicate the data with the second interface according to the second signaling scheme.

Aspect 24: The system of any of aspects 20 through 23, where: the first interface is configured to receive, from the host device, signaling that is indicative of one or more access commands associated with one or more memory dies of the set of memory dies, the signaling indicative of the one or more access commands communicated at the first frequency, and the first interface is configured to output the signaling indicative of the one or more access commands to the one or more memory dies at the second frequency.

Aspect 25: The system of any of aspects 20 through 24, where the first interface is configured to be coupled with the host device over a quantity of second subchannels, the quantity of second subchannels being the same as the quantity of subchannels.

An apparatus is described. The following provides an overview of aspects of the apparatus as described herein:

Aspect 26: An apparatus, including: a memory die; a buffer coupled with the memory die and configured to be coupled with a host device; the buffer configured to: receive, from the memory die, data communicated at a second frequency and according to a second signaling scheme including a second quantity of voltage levels: and transmit, to the host device, the data at a first frequency higher than the second frequency and according to a first signaling scheme including a first quantity of voltage levels, where the first quantity of voltage levels is lower than the second quantity of voltage levels.

Aspect 27: The apparatus of aspect 26, where the buffer is further configured to: receive, from the host device, second data communicated at the first frequency and according to the first signaling scheme: and transmit, to the memory die, the second data at the second frequency and according to the second signaling scheme.

Aspect 28: The apparatus of any of aspects 26 through 27, where the buffer is further configured to: receive, from the host device, signaling indicative of an access command associated with the memory die at the first frequency and according to the first signaling scheme; and transmit, to the memory die, the signaling indicative of the access command at the second frequency and according to the second signaling scheme.

Aspect 29: The apparatus of any of aspects 26 through 28, where the buffer is further configured to: transmit the data to the host device at a same data rate at which the data is received from the memory die based at least in part on receiving the data at the second frequency and according to the second signaling scheme.

Aspect 30: The apparatus of any of aspects 26 through 29, where the first frequency is double the second frequency.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration." and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, EEPROM, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a buffer comprising a first interface and a second interface, the first interface configured to be coupled with a host device and the second interface configured to be coupled with one or more memory dies, the buffer configured to:
receive, at the first interface and from the host device, data communicated at a first frequency and according to a first signaling scheme comprising a first quantity of voltage levels; and
output, from the second interface to a memory die of the one or more memory dies, the data at a second frequency lower than the first frequency and according to a second signaling scheme comprising a second quantity of voltage levels, wherein the second quantity of voltage levels is greater than the first quantity of voltage levels.

2. The apparatus of claim 1, wherein the buffer is further configured to:
receive, at the second interface and from the memory die, second data communicated at the second frequency and according the second signaling scheme; and
output, from the first interface to the host device, the second data at the first frequency and according to the first signaling scheme.

3. The apparatus of claim 1, wherein the buffer is further configured to:
receive, at the first interface and from the host device, signaling indicative of an access command associated with the memory die at the first frequency and according to the first signaling scheme; and
output, from the second interface to the memory die, the signaling indicative of the access command at the second frequency and according to the second signaling scheme.

4. The apparatus of claim 1, wherein:
the data is received over a first subchannel between the buffer and the host device and output over a second subchannel between the buffer and the memory die, and
each of the first subchannel and the second subchannel comprise a same number of signal paths.

5. The apparatus of claim 1, wherein the buffer is further configured to:
output the data at a same data rate at which the data is received based at least in part on outputting the data at the second frequency and according to the second signaling scheme.

6. The apparatus of claim 1, wherein the first frequency is double the second frequency.

7. A system, comprising:
a set of memory dies located on a memory module; and
a buffer located on the memory module and comprising a first interface and a second interface, the first interface configured to be coupled with a host device and the second interface configured to be coupled with the set of memory dies,
wherein a memory die of the set of memory dies is configured to output data to the second interface of the buffer at a second frequency and according to a second signaling scheme comprising a second quantity of voltage levels, and
wherein the buffer is configured to output, from the first interface to the host device, the data at a first frequency higher than the second frequency and according to a first signaling scheme comprising a first quantity of voltage levels, wherein the first quantity of voltage levels is less than the second quantity of voltage levels.

8. The system of claim 7, wherein the buffer is further configured to:
receive, at the first interface and from the host device, second data communicated at the second frequency and according to the first signaling scheme; and
output, from the first interface to the memory die, the second data at the second frequency and according to the second signaling scheme.

9. The system of claim 7, wherein the buffer is further configured to:
receive, at the first interface and from the host device, signaling indicative of an access command associated with the memory die at the first frequency and according to the first signaling scheme; and
output, from the second interface to the memory die, the signaling indicative of the access command at the second frequency and according to the second signaling scheme.

10. The system of claim 7, wherein:
each memory die of the set of memory dies is coupled with the second interface over a subchannel, each subchannel comprising a first quantity of signal paths between the second interface and a respective memory die, and
the first interface comprises a second quantity of signal paths equal to a product of the first quantity of signal paths and a quantity of the set of memory dies.

11. The system of claim 7, wherein the memory die of the set of memory dies comprises:
a mode register configured to indicate whether the memory die is configured to communicate with the buffer according to the second signaling scheme or according to the first signaling scheme.

12. The system of claim 7, wherein the buffer is further configured to:
output the data from the first interface at a same data rate at which the memory die is configured to output the data to the second interface based at least in part on receiving the data at the second interface at the second frequency and according to the second signaling scheme.

13. The system of claim 7, wherein the second frequency is double the first frequency.

14. The system of claim 7, wherein the second interface is configured to be coupled with the set of memory dies via unterminated subchannels or via subchannels that are terminated using respective components having a first impedance that is greater than a second impedance of the subchannels.

15. A method, comprising:
receiving, from a memory die at a buffer coupled with the memory die and a host device, data communicated at a second frequency and according to a second signaling scheme comprising a second quantity of voltage levels; and
transmitting, from the buffer to the host device, the data at a first frequency higher than the second frequency and according to a first signaling scheme comprising a first quantity of voltage levels, the first quantity of voltage levels being less than the second quantity of voltage levels.

16. The method of claim 15, further comprising:
receiving, from the host device at the buffer, second data communicated at the first frequency and according to the first signaling scheme; and
transmitting, from the buffer to the memory die, the second data at the second frequency and according to the second signaling scheme.

17. The method of claim 15, further comprising:
receiving, from the host device at the buffer, signaling indicative of an access command associated with the memory die at the first frequency and according to the first signaling scheme; and
transmitting, from the buffer to the memory die, the signaling indicative of the access command at the second frequency and according to the second signaling scheme.

18. The method of claim 15, further comprising:
transmitting the data to the host device at a same data rate at which the data is received from the memory die based at least in part on receiving the data at the second frequency and according to the second signaling scheme.

19. The method of claim 15, wherein the second frequency is double the first frequency.

20. An apparatus, comprising:
a memory die; and
a buffer coupled with the memory die and configured to be coupled with a host device; the buffer configured to:
receive, from the memory die, data communicated at a second frequency and according to a second signaling scheme comprising a second quantity of voltage levels; and
transmit, to the host device, the data at a first frequency higher than the second frequency and according to a first signaling scheme comprising a first quantity of voltage levels, wherein the first quantity of voltage levels is lower than the second quantity of voltage levels.

21. The apparatus of claim 20, wherein the buffer is further configured to:
receive, from the host device, second data communicated at the first frequency and according to the first signaling scheme; and
transmit, to the memory die, the second data at the second frequency and according to the second signaling scheme.

22. The apparatus of claim 20, wherein the buffer is further configured to:
receive, from the host device, signaling indicative of an access command associated with the memory die at the first frequency and according to the first signaling scheme; and
transmit, to the memory die, the signaling indicative of the access command at the second frequency and according to the second signaling scheme.

23. The apparatus of claim 20, wherein the buffer is further configured to:
transmit the data to the host device at a same data rate at which the data is received from the memory die based at least in part on receiving the data at the second frequency and according to the second signaling scheme.

24. The apparatus of claim 20, wherein the first frequency is double the second frequency.

* * * * *